United States Patent
Thomas et al.

(10) Patent No.: US 6,281,717 B1
(45) Date of Patent: Aug. 28, 2001

(54) DYNAMIC ERROR COMPENSATION IN TRACK-AND-HOLD CIRCUITS

(75) Inventors: David M. Thomas, Los Altos; Richard J. Reay, Mountain View, both of CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/457,628

(22) Filed: Dec. 8, 1999

(51) Int. Cl.[7] .............................. G11C 27/02; H03K 5/00; H03K 17/00
(52) U.S. Cl. ............................ 327/95; 327/362
(58) Field of Search .................. 327/91, 94, 95, 327/96, 379, 360, 362; 455/135, 222, 296, 501, 502, 503, 570, 637

(56) References Cited

U.S. PATENT DOCUMENTS 5,798,747 * 8/1998 Moraveji ........................ 345/98

OTHER PUBLICATIONS

Behzad Razavi, *Principles of Data Conversion System Design*, pp. 40–42, IEEE Press, 1995.

\* cited by examiner

*Primary Examiner*—Terry D. Cunningham
*Assistant Examiner*—Quani Tra
(74) *Attorney, Agent, or Firm*—Fish & Neave; Garry J. Tuma

(57) ABSTRACT

Circuits and methods are provided that compensate for dynamic errors caused by voltage drops across a switch coupled in series with a capacitor in an electrical circuit such as a track-and-hold circuit. In such circuits, the capacitor should provide the same voltage as a signal coupled to the switch, but does not because of the switch voltage drop. The switch can be, for example, a MOSFET or more particularly a CMOS device. Dynamic errors are compensated for by measuring the voltage drop across the switch and then effectively adding the measured voltage drop to a voltage provided by the capacitor.

56 Claims, 14 Drawing Sheets

$V_{CAP} = V_1 - V_{ERR}$ $V_{CAP} = V_1 - V_{ERR} - (-V_{ERR}) = V_1$

DYNAMIC ERROR COMPENSATION IN TRACK-AND-HOLD CIRCUITS

BACKGROUND OF THE INVENTION

This invention relates to track-and-hold circuits. More particularly, this invention relates to circuits and methods that compensate for dynamic errors in track-and-hold circuits.

A track-and-hold circuit (sometimes also known as a sample-and-hold circuit) typically operates in two modes—a track-mode that follows (i.e., tracks) an input signal, and a hold-mode that ideally produces and holds an output signal at the same voltage as an input signal received just prior to entering hold-mode. A track-and-hold circuit typically includes a switch coupled in series with a capacitor. The switch typically is CLOSED (i.e., conducts) in track-mode and is OPEN (i.e., does not conduct) in hold-mode. In track-mode, the capacitor ideally charges to the input signal voltage level. In hold-mode, the capacitor is isolated from any load and provides a fixed output signal voltage.

Track-and-hold circuits are commonly used at the front end of discrete time systems, such as, for example, analog-to-digital (A/D) converters. Such converters require a relatively constant input signal during the analog-to-digital conversion process. This may be difficult to obtain if the analog input signal is constantly changing, such as, for example, when the analog input signal is a sine wave. A track-and-hold circuit can provide an A/D converter with constant input signals indicative of tracked analog signals. The A/D converter can then measure and convert those constant signals to appropriate N-bit digital signals.

The switch of a track-and-hold circuit often comprises a MOSFET (metal-oxide-semiconductor field-effect-transistor), and in particular often comprises a CMOS (complimentary MOS) device. A CMOS device includes a PMOS (P-type MOS) FET and an NMOS (N-type MOS) FET. MOSFETs are often chosen as switches because their offset voltage is typically zero.

Ideally, the voltage drop across a CLOSED switch of a track-and-hold circuit should be zero. If the voltage drop is not zero, the capacitor voltage will not equal the input signal voltage. This can create voltage level errors in the output signal, which can cause errors during A/D bit conversion.

MOSFET switches exhibit voltage drops at high input signal frequencies. These voltage drops occur because of nonlinear resistance and capacitance in the MOSFET switch. The likely error in an output signal of a track-and-hold circuit (having a MOSFET switch) that receives, for example, a 20 MHz 1-volt AC input signal is about 0.5 mV. Such an output signal error can cause A/D bit-conversion errors. Moreover, the nonlinear resistance and capacitance of a MOSFET switch varies as a function of input voltage amplitude. Thus, the amount of error is typically dynamic, rendering error compensation difficult.

In view of the foregoing, it would be desirable to provide circuits and methods that compensate for dynamic errors caused by voltage drops across a switch in an electrical circuit such as a track-and-hold circuit.

SUMMARY OF THE INVENTION

It is an object of this invention to provide circuits and methods that compensate for dynamic errors caused by voltage drops across a switch in an electrical circuit such as a track-and-hold circuit.

In accordance with the principles of the present invention, circuits and methods are provided that compensate for voltage drops across a switch in electrical circuits, particularly track-and-hold circuits. In these electrical circuits, a voltage V is applied to a switch coupled in series with a capacitor. The capacitor should preferably charge to V, but instead charges to V minus the voltage drop across the CLOSED (i.e., conducting) switch. In one exemplary embodiment of the present invention, the voltage drop across the CLOSED switch is measured and added to a voltage provided by the capacitor. That voltage then substantially equals the voltage applied to the switch. The result in track-and-hold circuits is that the output signal voltage, which the capacitor provides, substantially equals the input signal voltage. In another exemplary embodiment, the voltage drop across the CLOSED switch is continuously measured, and then, at a given time, the measured voltage drop and the input signal are sampled. The sampled voltage drop is then added to a voltage provided by the capacitor. Again, the result in track-and-hold circuits is that the output signal voltage substantially equals the sampled input signal voltage.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention provides circuits and methods that compensate for dynamic errors caused by a switch in an electrical circuit. The switch is coupled in series between a first node and a capacitor that ideally provides a voltage equal to the voltage of a signal coupled to the first node. The circuits and methods of the present invention measure the voltage drop across the switch and then compensate for that drop by adding back the measured voltage to voltage provided by the capacitor.

These circuits and methods are preferably used with track-and-hold circuits, which are sometimes referred to as sample-and-hold circuits. Note that in those cases where sample-and-hold circuits are distinguished from track-and-hold circuits, the present invention is applicable to both.

Figure 1:
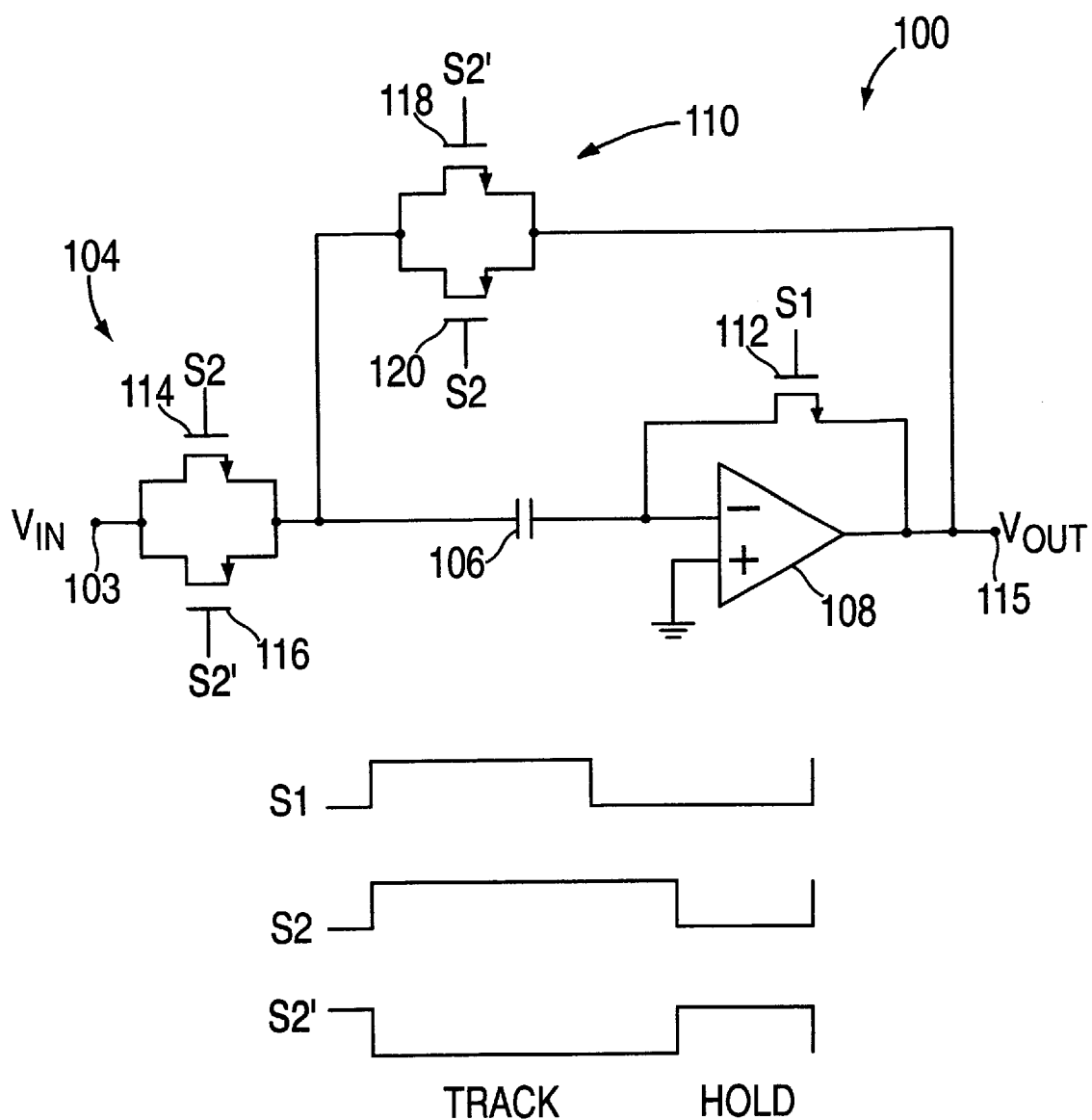
FIG. 1 is a circuit diagram of a typical track-and-hold circuit.

FIG. 1 shows a typical track-and-hold circuit 100 that includes a CMOS switch 104. Alternatively, switch 104 can be an NMOS or PMOS FET. Track-and-hold circuit 100 also includes capacitor 106, CMOS switch 110, difference amplifier (amp) 108, and NMOS FET switch 112. NMOS FET switch 112 is controlled by control signal S1. CMOS switch 104 includes NMOS FET 114 and PMOS FET 116. NMOS FET 114 is controlled by control signal S2, and PMOS FET 116 is controlled by complimentary control signal S2'. CMOS switch 110 includes NMOS FET 118 and PMOS FET 120. NMOS FET 118 is controlled by signal S2', and PMOS FET 120 is controlled by signal S2.

Track-and-hold circuit 100 operates in track-mode and hold-mode. In track-mode, CMOS switch 104 and switch 112 are CLOSED (i.e., they conduct), while CMOS switch 110 is OPEN (i.e., it does not conduct). Capacitor 106 ideally charges to the value of the input voltage, $V_{IN}$, at node 103. While in track-mode, the charge on capacitor 106 follows $V_{IN}$. The output voltage, $V_{OUT}$, at output node 115, is about zero volts.

In hold-mode, CMOS switch 104 and switch 112 are OPEN, while CMOS switch 110 is CLOSED. Capacitor 106, which ideally has been charged to the value of $V_{IN}$ just prior to track-and-hold circuit 100 entering hold-mode, provides and holds $V_{OUT}$ at a constant voltage ideally equal to $V_{IN}$. Difference amp 108 buffers capacitor 106 to prevent a load from discharging capacitor 106.

Figure 2A:
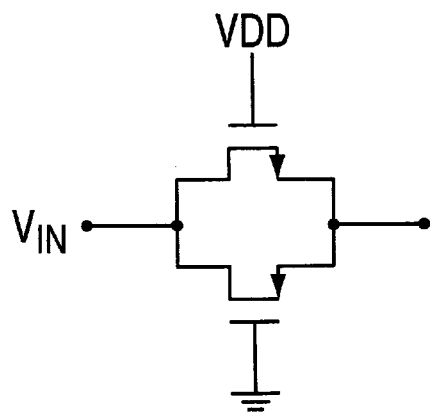
FIGS. 2A and 2B are circuit diagrams of a CMOS switch and its equivalent resistance and capacitance circuit, respectively.
Figure 2B:
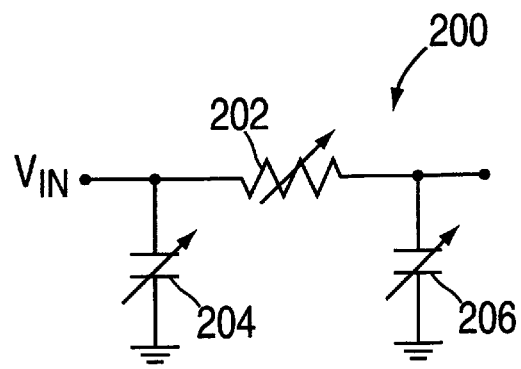
Figure 3A:
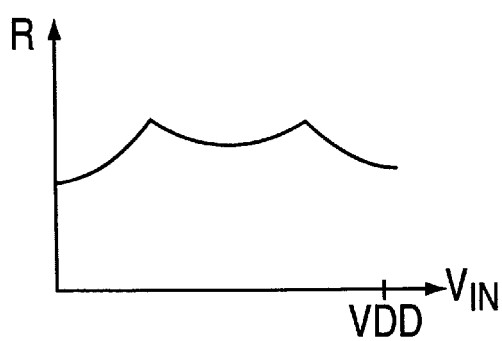
FIGS. 3A and 3B are general illustrations of nonlinear resistance and capacitance waveforms, respectively, of the CMOS switch equivalent circuit of FIG. 2B.
Figure 3B:
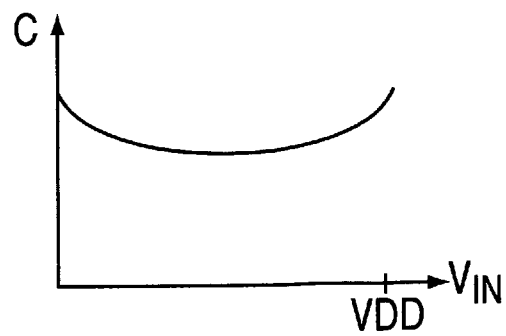

As shown in FIGS. 2A and 2B, a CMOS switch can be represented by an equivalent nonlinear resistance and capacitance circuit 200. The values of variable resistor 202 and variable capacitors 204 and 206 are a function of input voltage amplitude. The resulting resistance and capacitance value waveforms are shown in FIGS. 3A and 3B, respectively. These variable resistance and capacitance values cause voltage drops across the switch that adversely affect the voltage on capacitor 106, and consequently, the output signal voltage.

Figure 4:
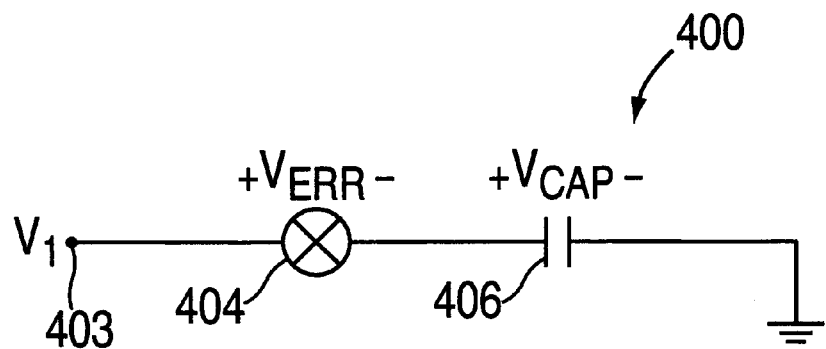
FIG. 4 is a circuit diagram illustrating the effect on capacitor voltage of a voltage drop across a switch.

FIG. 4 illustrates the effect on capacitor voltage of a voltage drop across a switch coupled to a capacitor as shown. Electrical circuit 400 includes node 403, switch 404, and capacitor 406. Switch 404 can be a CMOS device, an NMOS or PMOS FET, or any other type of switch that exhibits a voltage drop, $V_{ERR}$. This voltage drop causes capacitor 406 to charge to less than the voltage at node 403 (i.e., $V_{CAP}=V_1-V_{ERR}$). Moreover, the voltage drop varies nonlinearly as a function of input voltage amplitude, and is thus a dynamic voltage error. The resulting effect may be undesirable in many electrical circuit applications, such as, for example, analog-to-digital signal conversion where $V_1$ is an input voltage and capacitor 406 provides an output voltage that should ideally equal the input voltage.

Figure 5:
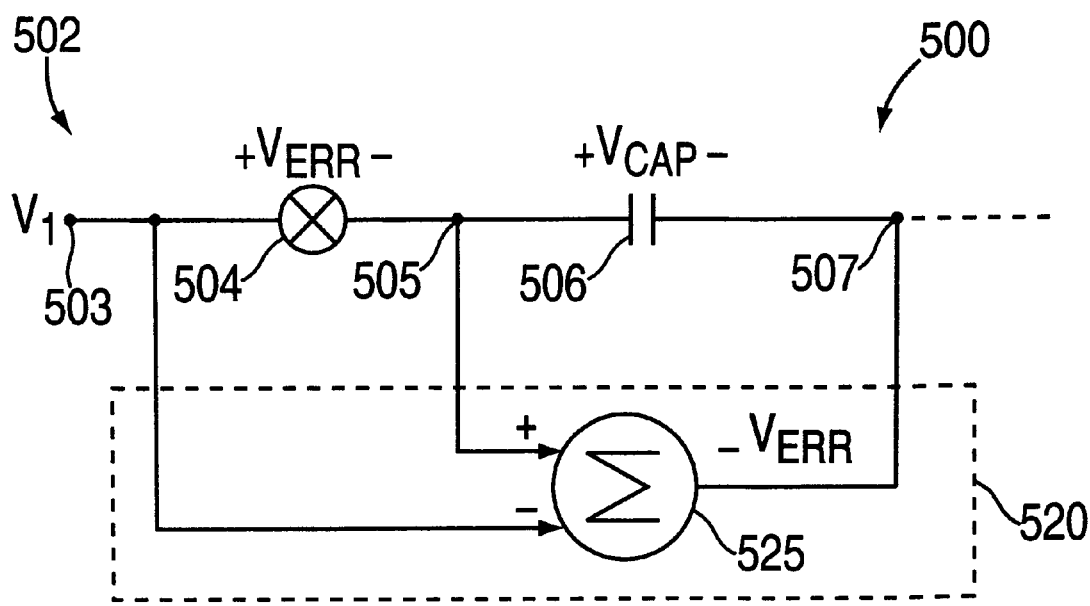
FIG. 5 is a circuit diagram of a first exemplary embodiment of dynamic error compensation circuitry used with a portion of an electrical circuit according to the present invention.

FIG. 5 shows a first exemplary embodiment of dynamic error compensation circuitry used with a portion 502 of an electrical circuit in accordance with the principles of the present invention. Dynamic error compensation circuitry 520 includes a difference circuit 525 having one input coupled to node 503, another input coupled to node 505, and an output coupled to node 507. Difference circuit 525 outputs the difference (with respect to ground) between the two inputs. Thus difference circuit 525 compensates for the dynamic error caused by the voltage drop across switch 504 by measuring that voltage drop and then effectively adding the measured voltage to the voltage at node 505 provided by capacitor 506. Thus, the voltage provided by capacitor 506 at node 505 substantially equals the voltage at node 503:

$$V_{CAP}=V_1-V_{ERR}-(-V_{ERR})=V_1$$

Figure 6:
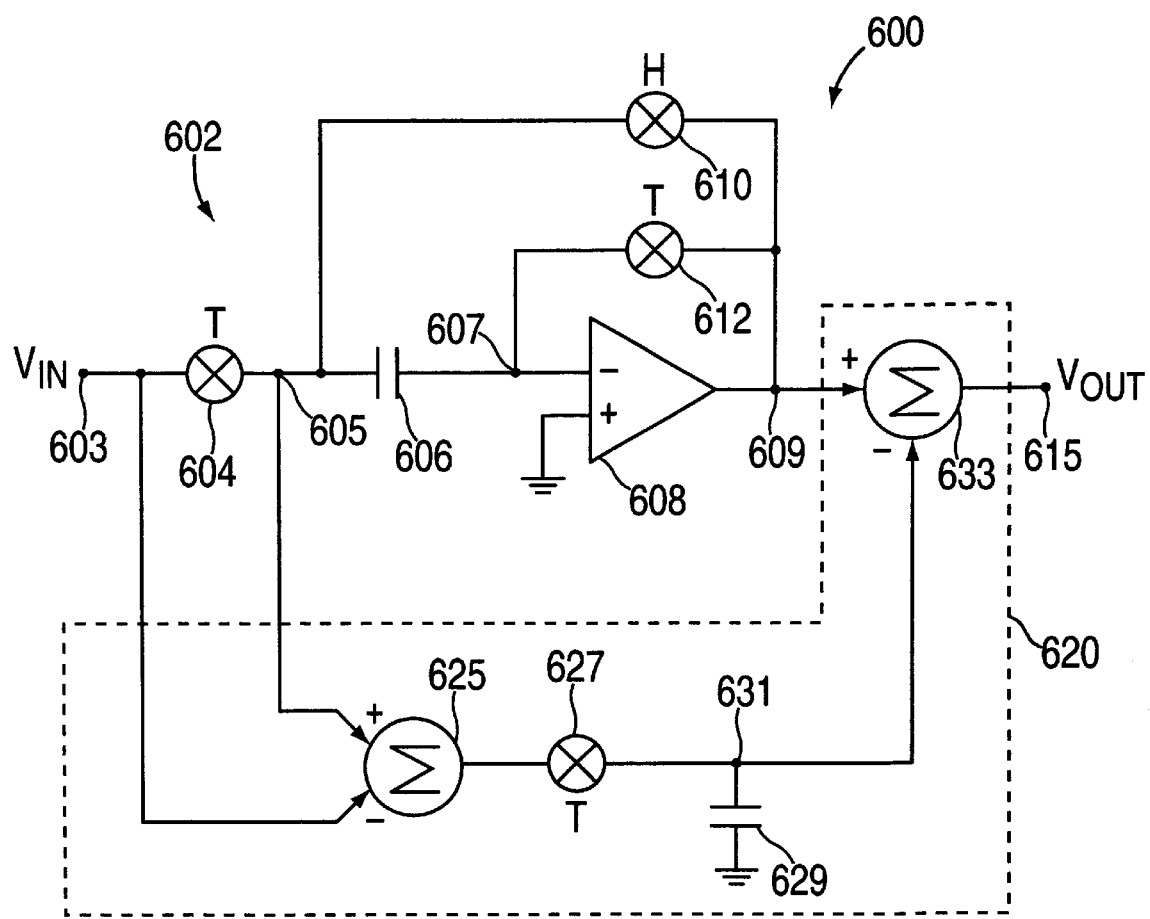
FIG. 6 is a circuit diagram of a second exemplary embodiment of dynamic error compensation circuitry used with a track-and-hold circuit according to the present invention.
Figure 6:
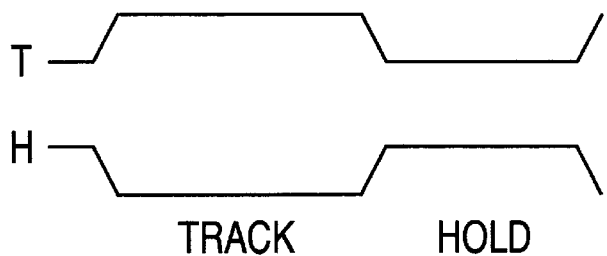

FIG. 6 shows a second exemplary embodiment of dynamic error compensation circuitry used with track-and-hold circuit 602 in accordance with the principles of the present invention. Track-and-hold circuit 602 operates similarly to track-and-hold circuit 100 and includes input node 603, switch 604, capacitor 606, difference amp 608, switch 610, switch 612, and output node 615. Switch 604 can be a CMOS device, NMOS or PMOS FET, or any other type of switch that exhibits a voltage drop causing a dynamic error. Switches 610 and 612 can be, for example, CMOS devices or NMOS or PMOS FETs. The OPEN and CLOSED states of switches 604 and 612 are controlled by control signal T, while the OPEN and CLOSED states of switch 610 are controlled by control signal H, as indicated in FIG. 6. Track-and-hold circuit 602 operates in track-mode when switch 604 and switch 612 are CLOSED and switch 610 is OPEN, and operates in hold-mode when switch 604 and switch 612 are OPEN and switch 610 is CLOSED. Note that in track-mode $V_{OUT}$ is of no consequence.

Dynamic error compensation circuitry 620, in accordance with the principles of the present invention, includes difference circuit 625, switch 627, capacitor 629, and difference circuit 633. Control signal T controls the OPEN and CLOSED states of switch 627. Difference circuit 625 subtracts voltage at input node 603 from voltage at node 605, producing a voltage indicative of the voltage drop across switch 604. Difference circuit 625 in effect measures the voltage drop across switch 604. In track-mode, switch 627 is CLOSED. This allows capacitor 629 to charge to the measured voltage drop across switch 604. Difference circuit 625 in effect measures the voltage drop across switch 604. In track-mode, compensation switch 627 is CLOSED. This allows compensation capacitor 629 to charge to the measured voltage drop across switch 604.

In hold-mode, switch 627 is OPEN, allowing the capacitor voltage at node 631, which represents the voltage drop across switch 604, to be effectively added at difference circuit 633 to the voltage on capacitor 606. In other words, when track-and-hold circuit 602 enters hold-mode, the input voltage and the voltage drop across switch 604 are sampled. The sampled input voltage minus the sampled switch 604 voltage drop (stored at capacitor 606) is added to the sampled switch 604 voltage drop (stored at capacitor 629). The output voltage at node 615 consequently equals substantially the sampled input voltage at node 603. Thus any dynamic errors caused by switch 604 are effectively compensated by dynamic error compensation circuitry 620.

Figure 7:
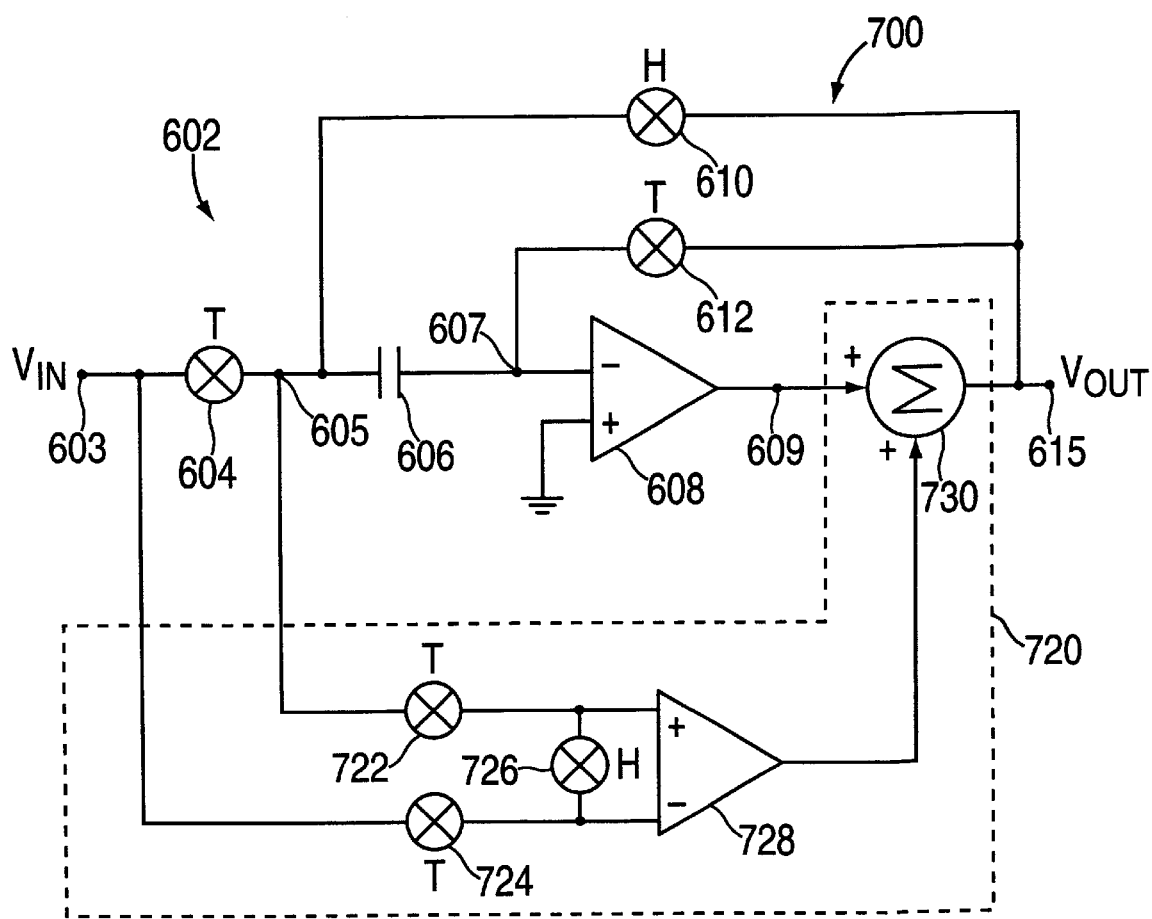
FIG. 7 is a circuit diagram of a third exemplary embodiment of dynamic error compensation circuitry used with a track-and-hold circuit according to the present invention.
Figure 7:
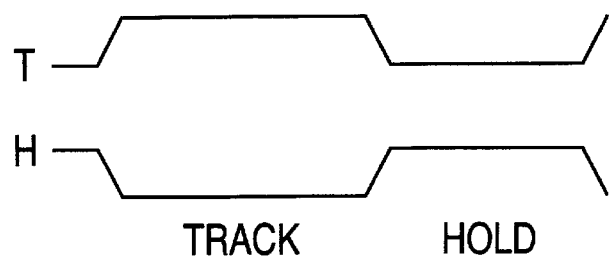

FIG. 7 shows a third exemplary embodiment of dynamic error compensation circuitry used with track-and-hold circuit 602 in accordance with the principles of the present invention. Dynamic error compensation circuitry 720 includes switches 722, 724, and 726; difference amp 728; and summing circuit 730. Switches 722 and 724 are controlled by control signal T, while switch 726 is controlled by control signal H. Preferably, the gains of difference amps 608 and 728 are precisely ratioed.

In track-mode, switches 604, 612, 722, and 724 are CLOSED, while switches 610 and 726 are OPEN. The output of difference amp 728, which is indicative of the voltage drop across switch 604, is summed at summing circuit 730 with the output of difference amp 608. The voltage at node 607 (via the circuit path from output node 615 through CLOSED switch 612) is thus substantially equal to the voltage drop across switch 604. Accordingly, the voltage across capacitor 606 substantially equals $V_{IN}$.

In hold-mode, switches 610 and 726 are CLOSED, while switches 604, 612, 722, and 724 are OPEN. The inputs to difference amp 728 are thus shorted together, the voltage at node 607 accordingly goes substantially to ground, and $V_{OUT}$ substantially equals the sampled value of $V_{IN}$. Thus, any dynamic errors caused by switch 604 are effectively compensated by compensation circuitry 720.

Figure 8:
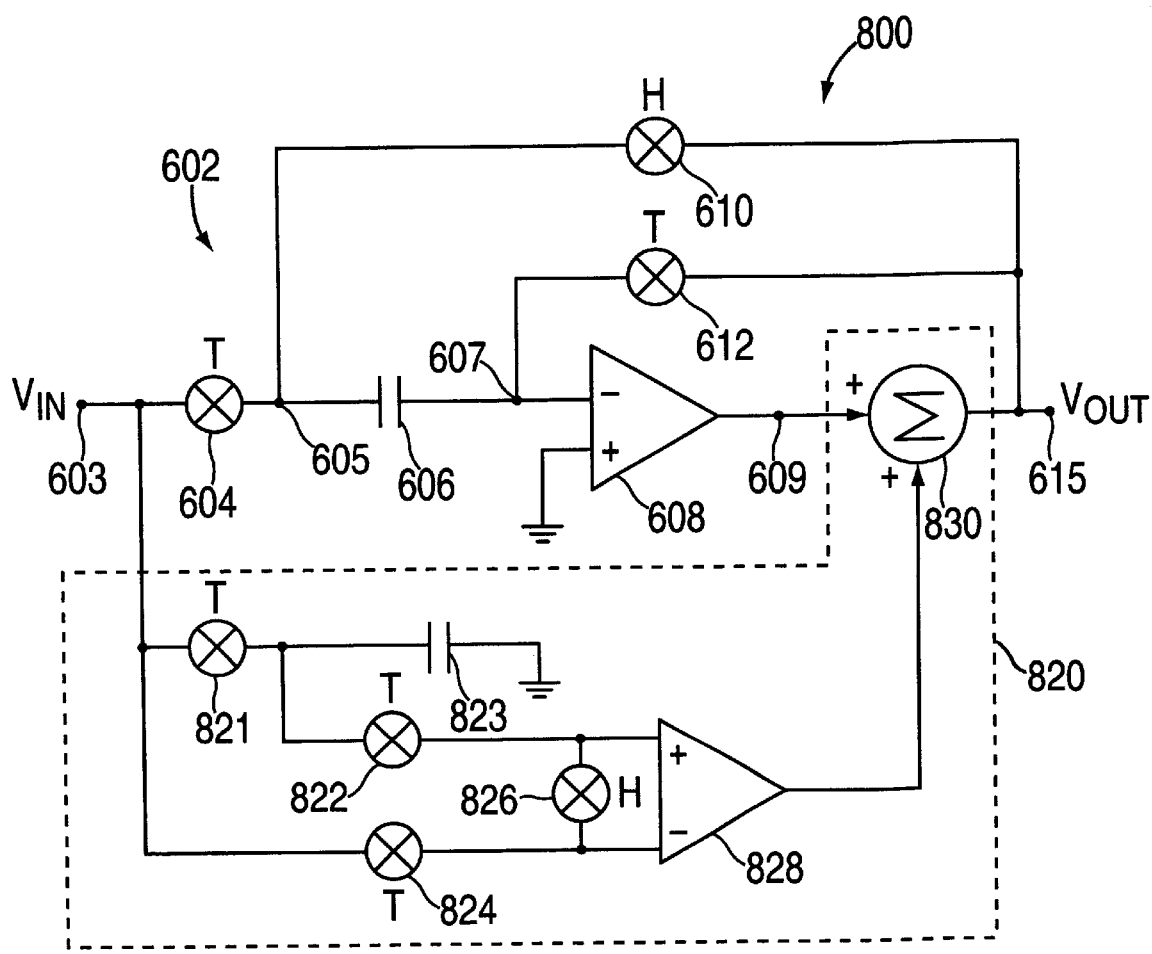
FIG. 8 is a circuit diagram of a fourth exemplary embodiment of dynamic error compensation circuitry used with a track-and-hold circuit according to the present invention.
Figure 8:
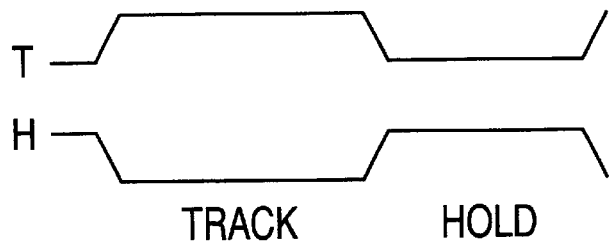

FIG. 8 shows a fourth exemplary embodiment of dynamic error compensation circuitry used with track-and-hold circuit 602 in accordance with the principles of the present invention. Dynamic error compensation circuitry 820 samples the voltage drop across switch 821 instead of switch 604. Preferably, switches 821 and 604 are matched (i.e., are of the same type (e.g., CMOS, NMOS, or PMOS) and have precisely ratioed widths). Dynamic error compensation circuitry 820 includes switches 821, 822, 824, and 826, capacitor 823, difference amp 828, and summing circuit 830. Switches 821, 822, and 824 are controlled by control signal T, while switch 826 is controlled by control signal H.

In track-mode, switches 604, 612, 821, 822, and 824 are CLOSED, while switches 610 and 826 are OPEN. Capacitor 823 stores the input voltage minus the voltage drop across switch 821 (similar to capacitor 606). Difference amp 828 outputs the voltage drop measured across switch 821, and summing circuit 830 adds the outputs of difference amps 608 and 828. The voltage at node 607 then substantially equals the voltage drop across switch 821, which mirrors the voltage drop across switch 604. Accordingly, the voltage across capacitor 606 substantially equals $V_{IN}$.

In hold-mode, switches 610 and 826 are CLOSED, while switches 604, 612, 821, 822, and 824 are OPEN. The inputs to difference amp 828 are thus shorted together, the voltage at node 607 consequently goes substantially to ground, and $V_{OUT}$ substantially equals the sampled value of $V_{IN}$ (through CLOSED switch 610 to the capacitor 606 voltage at node 605).

An advantage of this embodiment is that the gains of difference amps 608 and 828 can be different, which may be desirable for noise reasons. However, the following relationship should substantially be maintained:

$$\text{Difference amp}_{608} * C_{606} * S_{821} = \text{Difference amp}_{828} * C_{823} * S_{604}$$

where difference $\text{amp}_{608}$ and difference $\text{amp}_{828}$ are the respective gains of difference amps 608 and 828, $C_{606}$ and $C_{823}$ are the respective capacitances of capacitors 606 and 823, and $S_{821}$ and $S_{604}$ are the respective widths of switches 821 and 604.

Figure 9:
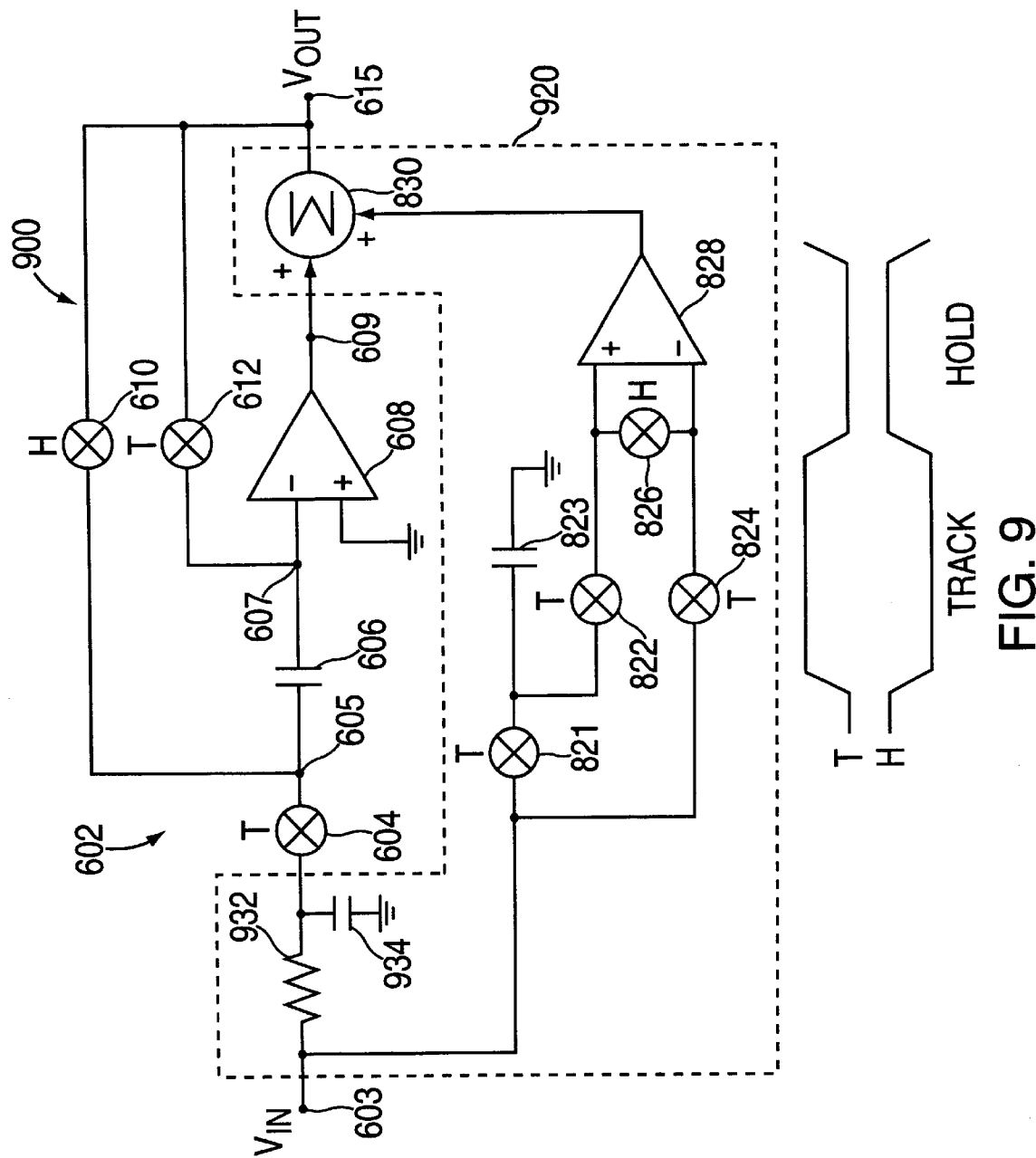
FIG. 9 is a circuit diagram of a further exemplary embodiment of the dynamic error compensation circuitry of FIG. 8 according to the present invention.

A further exemplary embodiment of dynamic error compensation circuitry 820 is shown in FIG. 9 with track-and-hold circuit 602 in accordance with the principles of the present invention. Dynamic error compensation circuitry 920 includes resistor 932 and capacitor 934 in addition to the circuit parts of dynamic error compensation circuitry 820. Resistor 932 and capacitor 934 provide phase delay to the main input signal path (input node 603 to node 607) of track-and-hold circuit 602 in order to compensate for any phase delay caused by dynamic error compensation circuitry 920.

Figure 10:
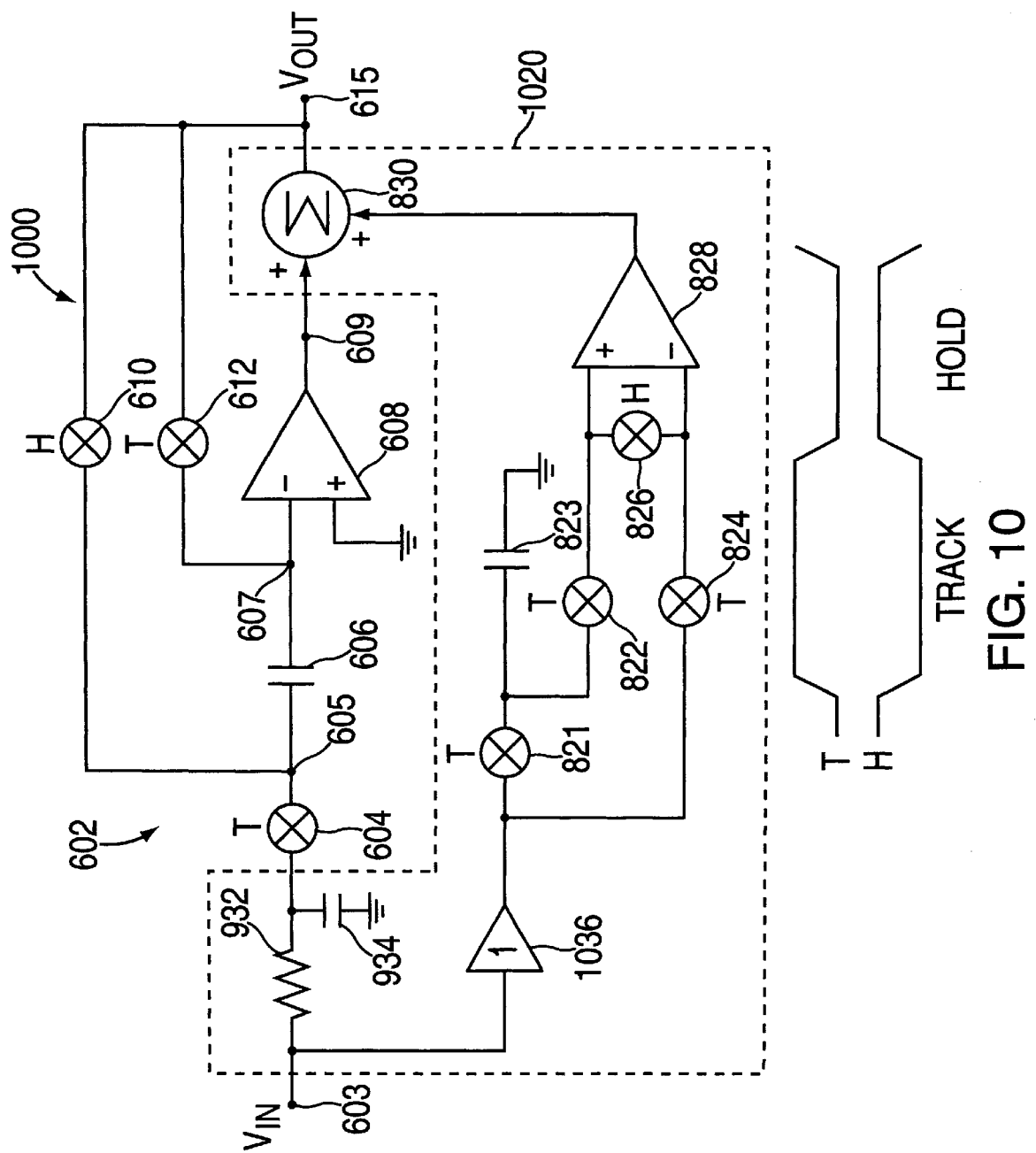
FIG. 10 is a circuit diagram of a further exemplary embodiment of the dynamic error compensation circuitry of FIG. 9 according to the present invention.
Figure 11:
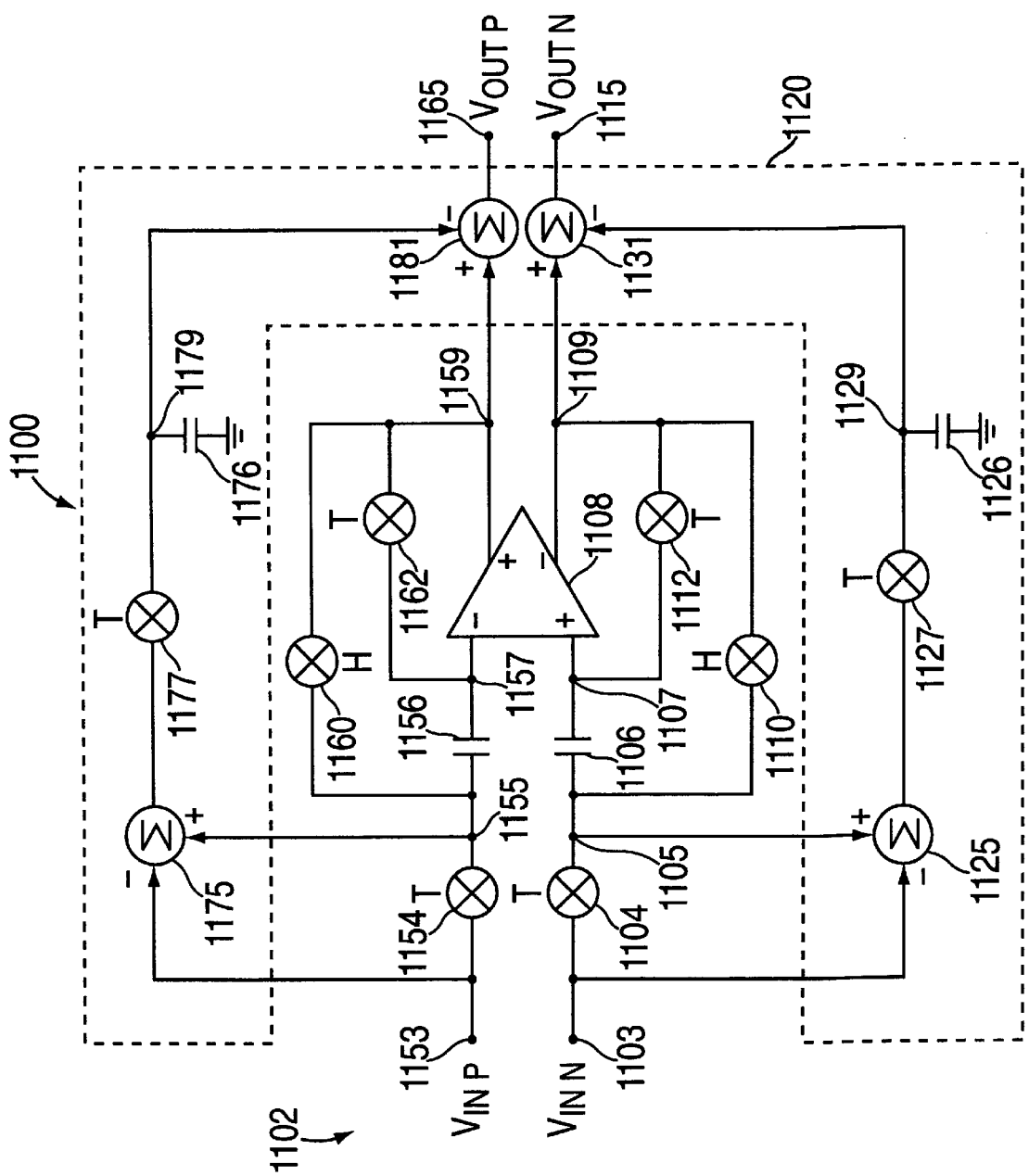
FIG. 11 is a circuit diagram of a differential version of the circuit of FIG. 6 according to the present invention.
Figure 12:
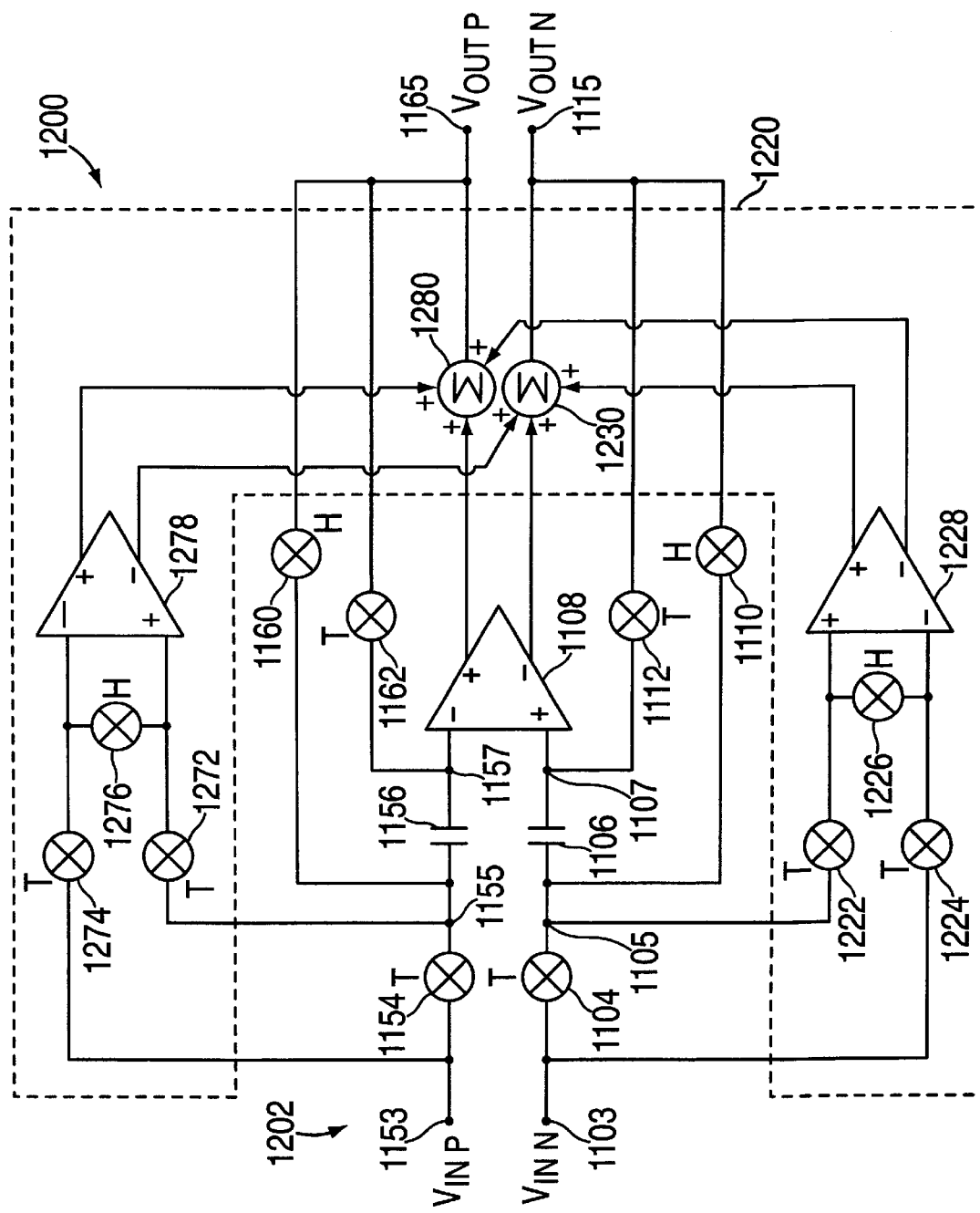
FIG. 12 is a circuit diagram of a differential version of the circuit of FIG. 7 according to the present invention.
Figure 13:
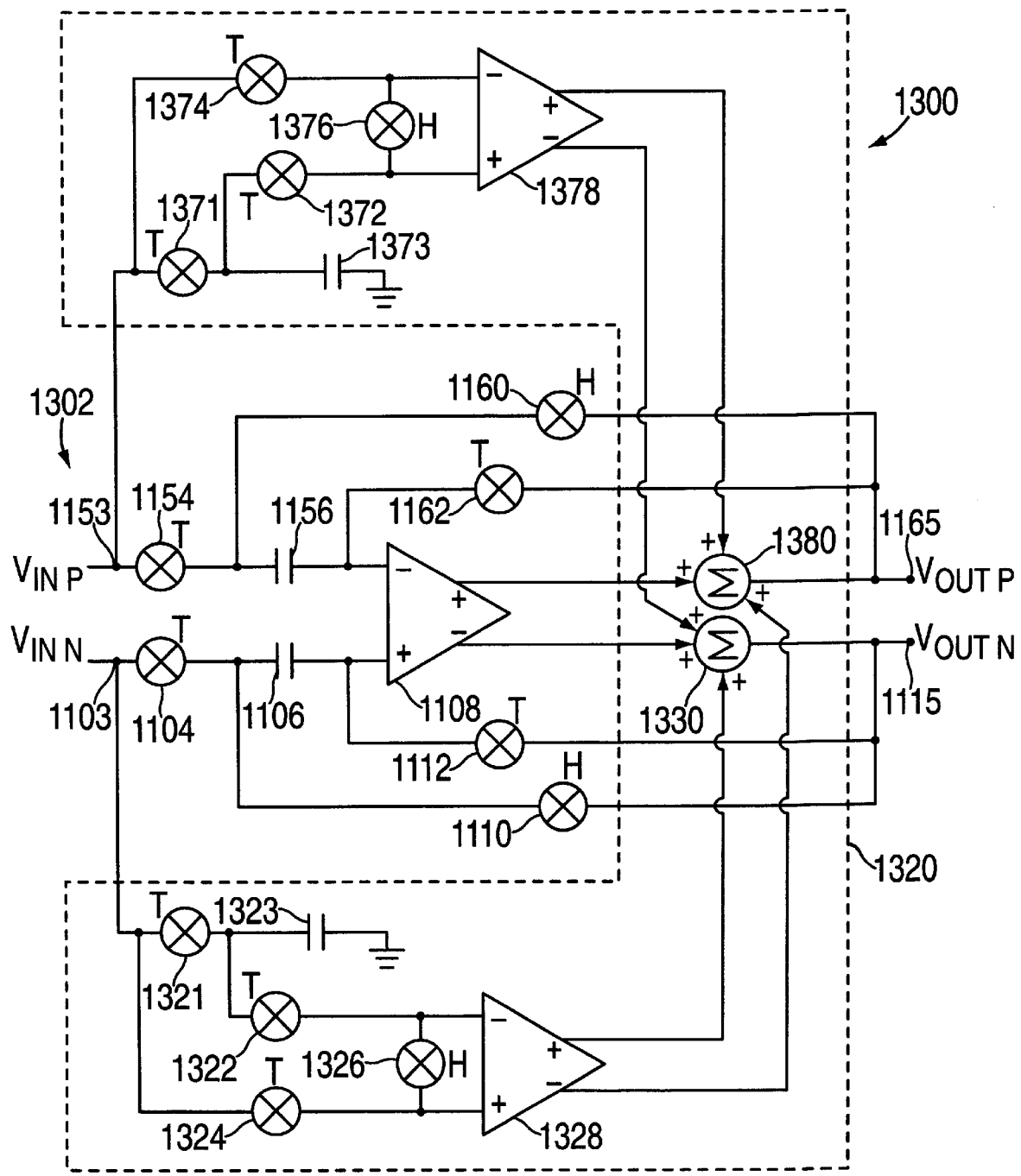
FIG. 13 is a circuit diagram of a differential version of the circuit of FIG. 8 according to the present invention.
Figure 14:
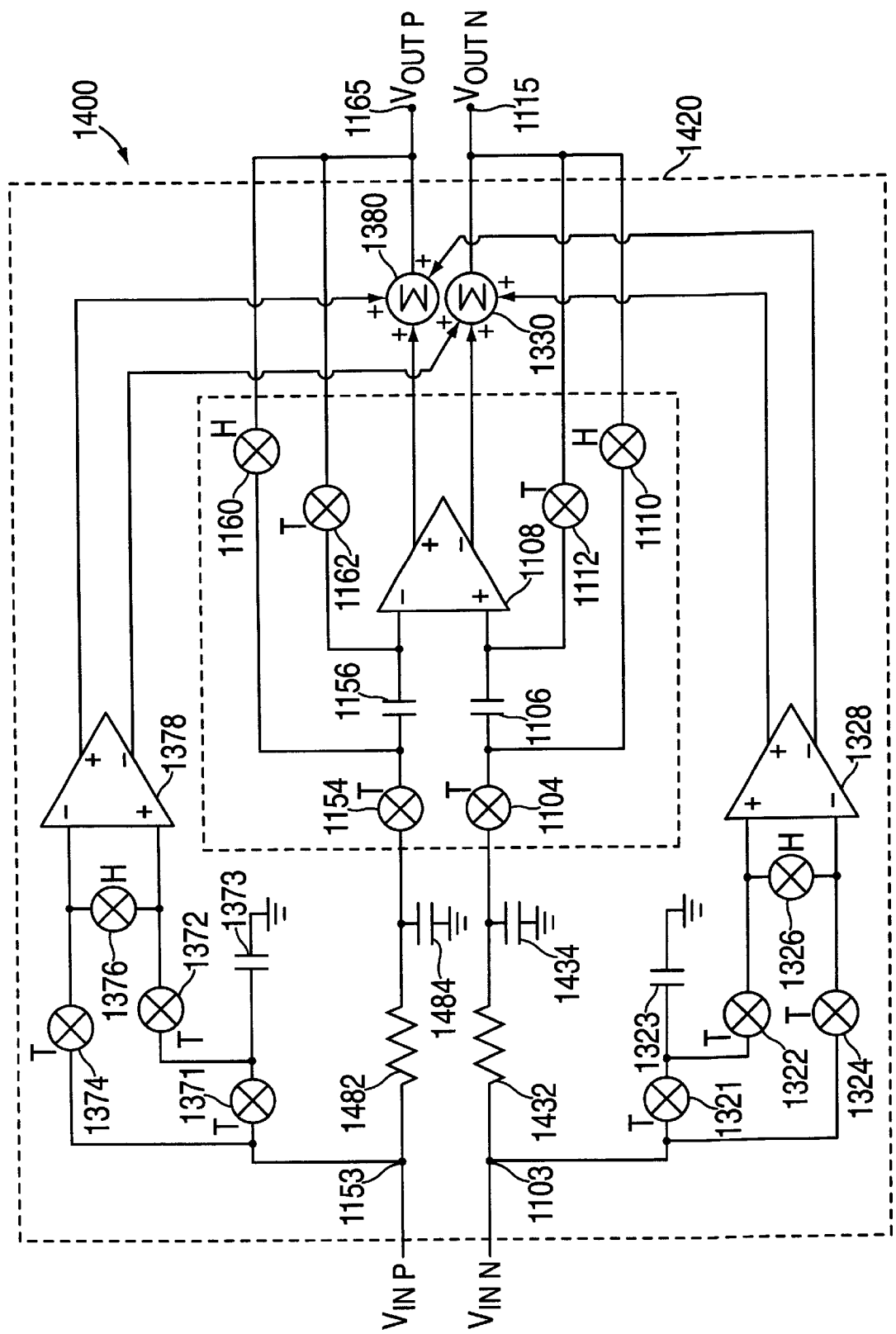
FIG. 14 is a circuit diagram of a differential version the circuit of FIG. 9 according to the present invention.
Figure 15:
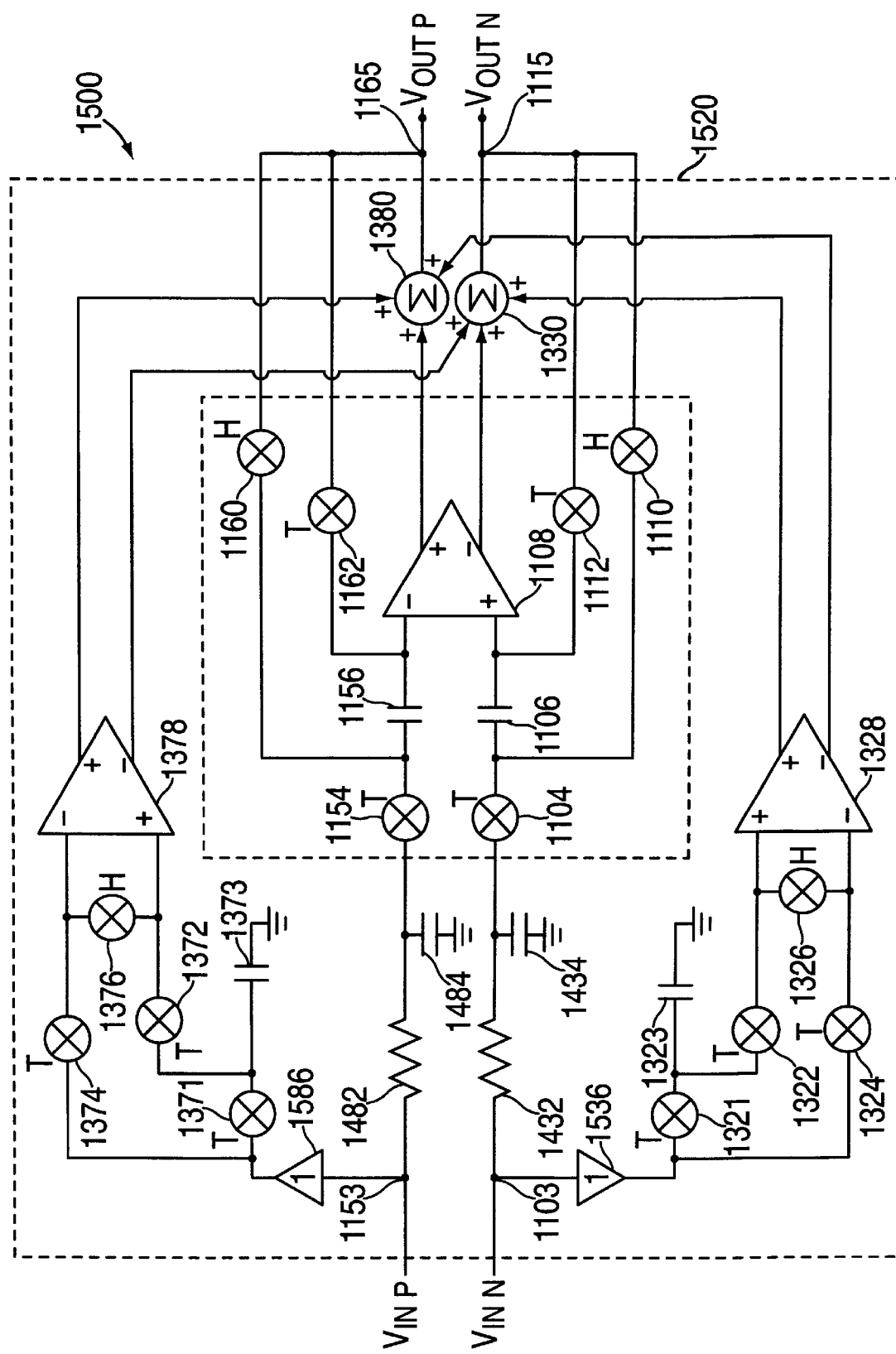
FIG. 15 is a circuit diagram of a differential version of the circuit of FIG. 10 according to the present invention.

A further exemplary embodiment of dynamic error compensation circuitry 920 is shown in FIG. 10 with track-and-hold circuit 602 in accordance with the principles of the present invention. Dynamic error compensation circuitry 1020 includes non-inverting buffer 1036 in addition to the circuit parts of dynamic error compensation circuitry 920. Buffer 1036, which drives switch 821, helps to reduce the effects of any dynamic error in switch 821 caused by a resistive source driving track-and-hold circuit 602. Buffer 1036 can also be used in compensation circuitry 820.

Although dynamic error compensation circuitries 620, 720, 820, 920, and 1020 have been shown with track-and-hold circuit 602, those skilled in the art will recognize that these dynamic error compensation circuitries can be used with other track-and-hold circuits and with other electrical circuits exhibiting similar dynamic error effects caused by voltage drops across a switch.

For example, the dynamic error compensation circuitries of the present invention can be used with a differential track-and-hold circuit as shown in FIGS. 11–15. FIGS. 11–15 are differential versions of the single-ended circuits shown respectively in FIGS. 6–10. Circuits 1100, 1200, 1300, 1400, and 1500 operate similarly to their corresponding single-ended versions (circuits 600, 700, 800, 900, and 1000, respectively) except that both positive and negative polarities of an input signal (i.e., $V_{INP}$ and $V_{INN}$) are provided to the circuit, and both positive and negative polarities of a compensated output signal (i.e., $V_{OUTP}$ and $V_{OUTN}$) are provided by the circuit. As shown, difference amps 1108, 1228, 1278, 1328, and 1378 each provide both polarities of a difference signal, and summing circuits 1230, 1280, 1330, and 1380 each sum three signals instead of the two summed by summing circuits 730 and 830.

Figure 16:
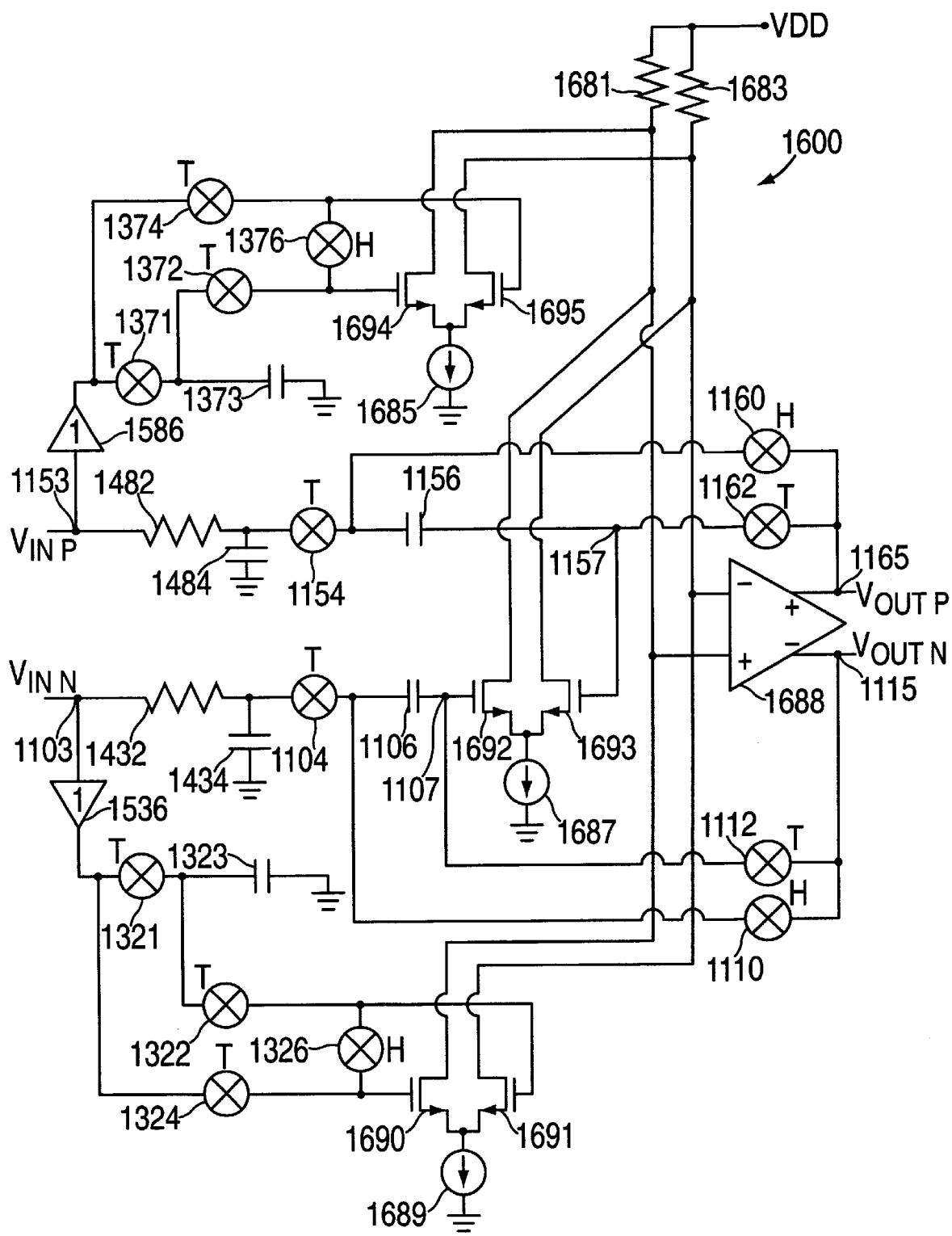
FIG. 16 is a circuit diagram of an exemplary embodiment of the dynamic-error-compensated track-and-hold circuit of FIG. 15 according to the present invention.

FIG. 16 shows an exemplary embodiment of a dynamic-error-compensated track-and-hold circuit 1600 in accordance with the principles of the present invention. Circuit 1600 is an example of an integrated circuit implementation of circuit 1500 in which the functions of difference amps 1108, 1328, and 1378 and summing circuits 1330 and 1380 are preferably implemented with difference amp 1688; current sources 1685, 1687, and 1689; and ratioed differential NMOS FET pairs 1690 and 1691, 1692 and 1693, and 1694 and 1695. Those skilled in the art will recognize that differential circuits 1200, 1300, and 1400 can also be similarly implemented.

Thus it is seen that circuits and methods are provided to compensate for dynamic errors caused by a switch in an electrical circuit such as a track-and-hold circuit. Those skilled in the art will appreciate that the present invention can be practiced by other than the described embodiments, which are presented for purposes of illustration and not of limitation, and the present invention is limited only by the claims which follow.

We claim:

1. Dynamic error compensation circuitry for use with an electrical circuit, said electrical circuit having a first node, a switch, a capacitor, and a second node, said switch coupled in series between said first node and said capacitor, said capacitor coupled in series between said switch and said second node, said dynamic error compensation circuitry comprising:

a difference circuit having first and second inputs and an output, said first input coupled to said first node, said second input coupled to a third node between said switch and said capacitor, and said output coupled to said second node, wherein:

the magnitude of the voltage at said difference circuit output substantially equals the magnitude of the voltage drop across said switch while said switch is CLOSED, and output voltage of said electrical circuit includes voltage across said capacitor.

2. The dynamic error compensation circuitry of claim 1 wherein said switch comprises a MOSFET, said MOSFET being conductive while said switch is CLOSED and nonconductive while said switch is OPEN.

3. The dynamic error compensation circuitry of claim 1 wherein said switch comprises a CMOS device, said CMOS device being conductive while said switch is CLOSED and nonconductive while said switch is OPEN.

4. The dynamic error compensation circuitry of claim 1 wherein said electrical circuit comprises a track-and-hold circuit.

5. The dynamic error compensation circuitry of claim 1 wherein said electrical circuit comprises a sample-and-hold circuit.

6. Dynamic error compensation circuitry for use with an electrical circuit, said electrical circuit having a first node, a switch, a capacitor, and a difference amp, said difference amp having two inputs and at least one output, said switch coupled in series between said first node and said capacitor, said capacitor coupled in series between said switch and a difference amp input, said switch being CLOSED in a first mode and OPEN in a second mode, said dynamic error compensation circuitry comprising:

a first difference circuit having an output, a first input coupled to said first node, and a second input coupled to a second node between said switch and said capacitor;

a second difference circuit having an output, a first input coupled to said difference amp output, and a second input;

a second switch coupled in series between said first difference circuit output and said second input of said second difference circuit, said second switch being CLOSED in said first mode and OPEN in said second mode; and a second capacitor coupled between ground and a third node between said second switch and said second input of said second difference circuit.

7. The dynamic error compensation circuitry of claim 6 wherein said electrical circuit comprises a track-and-hold circuit, said first mode corresponding to a track-mode and said second mode corresponding to a hold-mode of said track-and-hold circuit.

8. The dynamic error compensation circuitry of claim 6 wherein said electrical circuit comprises a sample-and-hold circuit.

9. The dynamic error compensation circuitry of claim 6 wherein said switch comprises a MOSFET, said MOSFET being conductive while said switch is CLOSED and nonconductive while said switch is OPEN.

10. The dynamic error compensation circuitry of claim 6 wherein said switch comprises a CMOS device, said CMOS device being conductive while said switch is CLOSED and nonconductive while said switch is OPEN.

11. The dynamic error compensation circuitry of claim 6 wherein said second switch comprises a MOSFET, said MOSFET being conductive while said second switch is CLOSED and nonconductive while said second switch is OPEN.

12. Dynamic error compensation circuitry for use with an electrical circuit, said electrical circuit having a first node, a first switch, a capacitor, and a first difference amp having a non-inverting input, an inverting input, and at least one output, said first switch coupled in series between said first node and said capacitor, said capacitor coupled in series between said first switch and one of said first difference amp inputs, said first switch being CLOSED in a first mode and OPEN in a second mode; said dynamic error compensation circuitry comprising:

a second difference amp having an inverting input, a non-inverting input, and at least one output;

a second switch coupled in series between said second difference amp non-inverting input and a second node between said first switch and said capacitor;

a third switch coupled in series between said second difference amp inverting input and said first node;

a fourth switch coupled in series between said second difference amp non-inverting and inverting inputs; and a summing circuit having one input coupled to said first difference amp output, another input coupled to said second difference amp output, and an output; wherein:

said second and third switches are CLOSED in said first mode and OPEN in said second mode, and said fourth switch is OPEN in said first mode and CLOSED in said second mode.

13. The dynamic error compensation circuitry of claim 12 wherein:

said capacitor is coupled in series between said first switch and said first difference amp inverting input;

said first difference amp output comprises a non-inverting output;

said second difference amp output comprises a non-inverting output; and said one summing circuit input is coupled to said first difference amp non-inverting output and said another summing circuit input is coupled to said second difference amp non-inverting output.

14. The dynamic error compensation circuitry of claim 12 wherein said electrical circuit comprises a track-and-hold circuit, said first mode corresponding to a track-mode and said second mode corresponding to a hold-mode of said track-and-hold circuit.

15. The dynamic error compensation circuitry of claim 12 wherein said electrical circuit comprises a sample-and-hold circuit.

16. The dynamic error compensation circuitry of claim 12 wherein said first switch comprises a MOSFET, said MOSFET being conductive while said first switch is CLOSED and nonconductive while said first switch is OPEN.

17. The dynamic error compensation circuitry of claim 12 wherein said first switch comprises a CMOS device, said CMOS device being conductive while said first switch is CLOSED and nonconductive while said first switch is OPEN.

18. The dynamic error compensation circuitry of claim 12 wherein at least one of said second, third, and fourth switches comprises a MOSFET, said MOSFET being conductive while said at least one switch is CLOSED and nonconductive while said at least one switch is OPEN.

19. The dynamic error compensation circuitry of claim 12 wherein said first difference amp and said second difference amp have gains that are substantially ratioed.

20. Dynamic error compensation circuitry for use with an electrical circuit, said electrical circuit having a first node, a first switch, a first capacitor, and a first difference amp having a non-inverting input, an inverting input, and at least one output, said first switch coupled in series between said first node and said first capacitor, said first capacitor coupled in series between said first switch and one of said first difference amp inputs, said first switch being CLOSED in a first mode and OPEN in a second mode; said dynamic error compensation circuitry comprising:

a second difference amp having an inverting input, a non-inverting input, and at least one output;

a second switch coupled in series between said first node and a second node;

a second capacitor coupled in series between said second node and ground;

a third switch coupled in series between said second node and said second difference amp non-inverting input;

a fourth switch coupled in series between said first node and said second difference amp inverting input;

a fifth switch coupled in series between said second difference amp non-inverting and inverting inputs; and a summing circuit having one input coupled to said first difference amp output, another input coupled to said second difference amp output, and an output; wherein:

said second, third, and fourth switches are CLOSED in said first mode and OPEN in said second mode, and said fifth switch is OPEN in said first mode and CLOSED in said second mode.

21. The dynamic error compensation circuitry of claim 20 wherein:

said first capacitor is coupled in series between said first switch and said first difference amp inverting input;

said first difference amp output comprises a non-inverting output;

said second difference amp output comprises a non-inverting output; and said one summing circuit input is coupled to said first difference amp non-inverting output and said another summing circuit input is coupled to said second difference amp non-inverting output.

22. The dynamic error compensation circuitry of claim 20 wherein said electrical circuit comprises a track-and-hold circuit, said first mode corresponding to a track-mode and said second mode corresponding to a hold-mode of said track-and-hold circuit.

23. The dynamic error compensation circuitry of claim 20 wherein said electrical circuit comprises a sample-and-hold circuit.

24. The dynamic error compensation circuitry of claim 20 wherein said first switch comprises a MOSFET, said MOSFET being conductive while said first switch is CLOSED and nonconductive while said first switch is OPEN.

25. The dynamic error compensation circuitry of claim 20 wherein said first switch comprises a CMOS device, said CMOS device being conductive while said first switch is CLOSED and nonconductive while said first switch is OPEN.

26. The dynamic error compensation circuitry of claim 20 wherein at least one of said second, third, fourth, and fifth switches comprises a MOSFET, said MOSFET being conductive while said at least one switch is CLOSED and nonconductive while said at least one switch is OPEN.

27. The dynamic error compensation circuitry of claim 20 wherein said first difference amp and said second difference amp each have a gain, said first capacitor and said second capacitor each have a capacitance, and said first switch and said second switch each have a width, the product of said first difference amp gain, said first capacitor capacitance, and said second switch width substantially equaling the product of said second difference amp gain, said second capacitor capacitance, and said first switch width.

28. The dynamic error compensation circuitry of claim 20 further comprising:

a resistor coupled in series between said first node and said first switch; and a third capacitor coupled between ground and a third node between said resistor and said first switch.

29. The dynamic error compensation circuitry of claim 28 further comprising a buffer coupled in series between said first node and said second switch, said fourth switch being coupled in series between said second difference amp inverting input and a fourth node between said buffer and said second switch.

30. The dynamic error compensation circuitry of claim 20 further comprising a buffer coupled in series between said first node and said second switch, said fourth switch being coupled in series between said second difference amp inverting input and a third node between said buffer and said second switch.

31. A method of compensating for dynamic errors caused by a switch in an electrical circuit, said electrical circuit also including a first node, a capacitor, and a second node, said switch coupled in series between said first node and said capacitor, said capacitor coupled in series between said switch and said second node, said method comprising:

measuring a voltage drop across said switch while said switch is CLOSED; and adding said measured voltage drop to a voltage provided by said capacitor.

32. The method of claim 31 wherein said measuring a voltage drop comprises coupling inputs of a difference circuit across said switch.

33. The method of claim 32 wherein said adding said measured voltage drop comprises coupling an output of said difference circuit to said second node.

34. The method of claim 31 wherein said electrical circuit also includes a difference amp coupled between said capacitor and said second node, said difference amp having two inputs and at least one output, one of said difference amp inputs being coupled to said capacitor and said difference amp output being coupled to said second node, said measuring a voltage drop comprising:

coupling a second switch in series between said first node and an inverting input of a second difference amp;

coupling a third switch in series between a non-inverting input of said second difference amp and a node between said switch and said capacitor; and coupling a fourth switch in series between said second difference amp inverting and non-inverting inputs; wherein:

said second and third switches are OPEN while said switch is OPEN, and CLOSED while said switch is CLOSED; and said fourth switch is CLOSED while said switch is OPEN, and OPEN while said switch is CLOSED.

35. The method of claim 34 wherein said adding said measured voltage drop comprises:

coupling a first input of a summing circuit to said difference amp output;

coupling a second input of said summing circuit to an output of said second difference amp; and coupling an output of said summing circuit to said second node.

36. The method of claim 31 wherein said measuring a voltage drop comprises measuring a voltage drop across a second switch mirroring said switch.

37. The method of claim 36 wherein said measuring a voltage drop across a second switch comprises:

coupling a second switch in series between said first node and a third node;

coupling a second capacitor in series between said third node and ground; and coupling inputs of a difference amp across said second switch.

38. The method of claim 36 further comprising compensating for phase delays associated with said measuring said voltage drop across said second switch.

39. The method of claim 38 wherein said compensating for phase delays comprises:

coupling a resistor in series between said first node and said capacitor; and coupling a second capacitor between ground and a node between said first node and said capacitor.

40. The method of claim 36 further comprising compensating for dynamic errors exhibited by said measuring a voltage drop across a second switch.

41. The method of claim 40 wherein said compensating for dynamic errors comprises coupling a buffer between said first node and said second switch.

42. The method of claim 31 wherein said electrical circuit comprises a track-and-hold circuit.

43. The method of claim 31 wherein said switch comprises a MOSFET, said MOSFET being conductive while said switch is CLOSED and nonconductive while said switch is OPEN.

44. The method of claim 31 wherein said switch comprises a CMOS device, said CMOS device being conductive while said switch is CLOSED and nonconductive while said switch is OPEN.

45. A method of compensating for dynamic errors caused by a switch in an electrical circuit, said electrical circuit also including a first node, a capacitor, and a difference amp, said difference amp having an inverting input, a non-inverting input, and at least one output, said switch coupled in series between said first node and said capacitor, said capacitor coupled in series between said switch and one of said difference amp inputs, said method comprising:

measuring a voltage drop across said switch while said switch is CLOSED;

sampling said measured voltage drop; and adding said sampled measured voltage drop to a voltage representing a sampled input signal.

46. The method of claim 45 wherein said measuring a voltage drop comprises coupling first and second inputs of a difference circuit across said switch.

47. The method of claim 46 wherein said sampling said measured voltage drop comprises:

coupling a second switch in series between an output of said difference circuit and a second node; and coupling a capacitor between said second node and ground.

48. The method of claim 47 wherein said adding said sampled measured voltage drop comprises:

coupling a first input of a second difference circuit to said difference amp output; and coupling a second input of said second difference circuit to said second node; wherein an output of said second difference circuit provides a dynamic-error-compensated signal.

49. The method of claim 45 wherein said electrical circuit comprises a track-and-hold circuit.

50. The method of claim 45 wherein said electrical circuit comprises a sample-and-hold circuit.

51. The method of claim 45 wherein said switch comprises a MOSFET, said MOSFET being conductive while said switch is CLOSED and nonconductive while said switch is OPEN.

52. The method of claim 45 wherein said switch comprises a CMOS device, said CMOS device being conductive while said switch is CLOSED and nonconductive while said switch is OPEN.

53. A method of compensating for dynamic errors caused by first and second switches in a differential track-and-hold circuit, said first switch coupled in series between a first node and a first capacitor and said second switch coupled in series between a second node and a second capacitor, said circuit receiving a positive polarity input signal at said first node and a negative polarity input signal at said second node, said circuit providing a positive polarity output signal and a negative polarity output signal, said first capacitor supplying a voltage for said positive polarity output signal and said second capacitor supplying a voltage for said negative polarity output signal, said method comprising:

measuring a voltage drop across said first switch while said first switch is CLOSED;

measuring a voltage drop across said second switch while said second switch is CLOSED;

adding said first switch voltage drop to said voltage supplied by said first capacitor; and adding said second switch voltage drop to said voltage supplied by said second capacitor.

54. The method of claim 53 further comprising amplifying said positive and negative polarity output signals.

55. The method of claim 53 wherein said first and second switches each comprises a MOSFET, said MOSFET being conductive while said switch is CLOSED and nonconductive while said switch is OPEN.

56. The method of claim 53 wherein said first and second switches each comprises a CMOS device, said CMOS device being conductive while said switch is CLOSED and nonconductive while said switch is OPEN.

* * * * *

UNITED STATES PATENT AND TRADEMARK OFFICE
CERTIFICATE OF CORRECTION

PATENT NO. : 6,281,717 B1  
DATED : August 28, 2001  
INVENTOR(S) : David M. Thomas Page 1 of 1

It is certified that error appears in the above-identified patent and that said Letters Patent is hereby corrected as shown below:

<u>Column 4,</u>  
Line 53, delete "Difference circuit";  
Lines 54, 55, 56 and 57, delete in its entirety.

Signed and Sealed this

Twenty-eighth Day of May, 2002

*Attest:*

*Attesting Officer*

JAMES E. ROGAN  
*Director of the United States Patent and Trademark Office*